(12) United States Patent
Shin et al.

(10) Patent No.: US 6,777,341 B2
(45) Date of Patent: Aug. 17, 2004

(54) METHOD OF FORMING A SELF-ALIGNED CONTACT, AND METHOD OF FABRICATING A SEMICONDUCTOR DEVICE HAVING A SELF-ALIGNED CONTACT

(75) Inventors: Kyoung-sub Shin, Seongnam (KR); Ji-soo Kim, Yongin (KR); Gyung-jin Min, Seoul (KR); Tae-hyuk Ahn, Yongin (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 644 days.

(21) Appl. No.: 09/847,289

(22) Filed: May 3, 2001

(65) Prior Publication Data

US 2002/0034877 A1 Mar. 21, 2002

(30) Foreign Application Priority Data

Sep. 21, 2000 (KR) ........................................ 2000-55483

(51) Int. Cl.[7] ............................................ H01L 21/302
(52) U.S. Cl. ...................... 438/704; 438/725; 438/692; 438/239; 438/241; 438/250; 438/253
(58) Field of Search ................................ 438/239, 241, 438/250, 253, 704, 692, 725

(56) References Cited

U.S. PATENT DOCUMENTS

| 6,136,643 A | 10/2000 | Jeng et al. |
| 6,150,281 A | 11/2000 | Kwean |
| 6,177,320 B1 | * 1/2001 | Cho et al. ................... 438/279 |

(List continued on next page.)

FOREIGN PATENT DOCUMENTS

| GB | 2 333 179 | 7/1999 |
| JP | 10041482 | 2/1998 |
| JP | 2000021985 | 1/2000 |
| JP | 2000058482 | 2/2000 |
| JP | 2000040691 | 8/2000 |

OTHER PUBLICATIONS

Y. Kohyama et al., "A Fully Printable, Self–aligned and Planarized Stacked Capacitor DRAM Cell Technology for 1Gbit DRAM and Beyond", 1997 Symposium on VLSI Technology Digest of Technical Papers, pp. 17 & 18.

*Primary Examiner*—George A. Goudreau
(74) *Attorney, Agent, or Firm*—Volentine Francos, PLLC

(57) ABSTRACT

In a method of forming a self-aligned contact, gates are formed on a semiconductor substrate in a striped pattern. Bit lines are formed in a striped pattern that extends cross-wise to the gates. The bit lines are isolated from one another by a first interlayer insulation layer. Next, a second interlayer insulation layer is formed between the bit lines, and a photoresist film pattern is formed on the second interlayer insulation layer. The photoresist film pattern is used for forming contact holes extending between the gates down to conductive pads. The contact holes are filled to form conductive plugs that contact the conductive pads. The photoresist film pattern is formed as a series of stripes which extend parallel to the gates. The stripes of photoresist expose segments of the bit lines and the portions of the second interlayer insulation layer disposed directly above the conductive film pads, thereby securing a sufficient alignment margin, and exposing a large underlying area to be etched in forming the contact holes. To form a semiconductor device, a third interlayer insulation layer, an etch stop layer, an oxide layer and a hard mask layer are formed on the conductive plugs. Next, a second photoresist film pattern is formed on the hard mask layer. The hard mask layer and the oxide layer are etched using the second photoresist film pattern as an etching mask until the etch stop layer is exposed. Second contact holes for use in forming capacitor lower electrodes are formed by sequentially removing the exposed etching stop layer and the exposed third interlayer insulation layer using the hard mask layer as an etching mask, until the second contact holes expose the conductive plugs.

20 Claims, 21 Drawing Sheets

U.S. PATENT DOCUMENTS

| | | | |
|---|---|---|---|
| 6,197,670 B1 * | 3/2001 | Park | 438/586 |
| 6,342,449 B2 * | 1/2002 | Miyakawa | 438/692 |
| 6,344,692 B1 | 2/2002 | Ikemasu et al. | |
| 2001/0034135 A1 | 10/2001 | Miyakawa | |
| 2002/0027259 A1 * | 3/2002 | Ikemasu et al. | 257/499 |
| 2002/0096772 A1 * | 7/2002 | Ikemasu et al. | 257/758 |

* cited by examiner

METHOD OF FORMING A SELF-ALIGNED CONTACT, AND METHOD OF FABRICATING A SEMICONDUCTOR DEVICE HAVING A SELF-ALIGNED CONTACT

BACKGROUND OF THE INVENTION

1. Field of the Invention

The present invention relates to a method of fabricating a semiconductor device. More particularly, the present invention relates to a technique of forming a self-aligned contact, and to a method of fabricating a semiconductor device having a self-aligned contact formed by such a technique.

2. Description of the Related Art

As semiconductor devices become smaller and smaller, the line width and the spacing between lines of the devices decrease. The resolution of a lithographic process used to form the lines of the semiconductor device must be increased to provide a smaller line width and spacing. However, the precision of an alignment technique, carried out to facilitate the lithographic process, can not be increased to comport with the increased resolution used to produce the fine line width and line spacing demanded of today'semiconductor devices. Accordingly, any misalignment during the fabrication of semiconductor must be minimized if a reduction in the size of semiconductor devices is to be achieved.

In the case of a semiconductor memory device, such as a dynamic random access memory (DRAM) including a capacitor, the capacitor is formed after a bit line is formed. A buried contact (BC) pad for electrically connecting the source/drain region of a transistor to the storage electrode of the capacitor is formed after the bit line is formed. A long and deep contact hole, i.e., a contact hole having a high aspect ratio, is required to form the BC pad. However, it is not easy to secure an alignment margin sufficient for a lithographic process to produce a contact hole having a high enough aspect ratio. In particular, an alignment margin can not be secured for a design rule of 0.20 $\mu$m or smaller.

Recently, a technique of forming a self-aligned contact hole has been mainly used in connection with the forming of a BC pad. In this technique, a contact hole is formed by depositing an insulation layer on a lower conductive layer, and performing an etching process using the lower conductive layer and the insulation layer as a mask. This method will be described below with reference to FIGS. 1–5.

FIG. 1 shows the layout of a photoresist layer pattern used as an etching mask in the conventional method of forming a self-aligned contact. FIGS. 2 through 5 are sectional views taken along the line I–I' of FIG. 1 and show the progression of the conventional method of forming a self-aligned contact.

In FIG. 1, reference numeral 100 denotes an active mask window for defining an active region and a field region. Reference numeral 110 denotes a gate mask window used for forming a gate stack pattern. Reference numeral 120 denotes a bit line mask window used for forming a bit line pattern. Reference numeral 130 denotes a photoresist layer pattern serving as an etching mask used for forming a self-aligned contact hole.

Referring to FIG. 2, isolation regions 210 defining active regions 205 are formed as trenches in a semiconductor substrate 200 using the active mask windows (100 in FIG. 1). A conductive film pad 220 is formed on each of the active region 205. A first interlayer insulation layer 230 is formed to completely cover the conductive film pads 220. Next, bit line stacks 240 are formed on the first interlayer insulation layer 230 using the bit line mask windows (120 in FIG. 1). Each of the bit line stacks 240 is formed by sequentially forming a barrier metal layer 241, a bit line conductive layer 242 and a bit line capping layer 243 one upon the other. Subsequently, bit line spacers 250 are formed on the sidewalls of each of the bit line stacks 240.

Referring to FIG. 3, a second interlayer insulation layer 260 is formed to completely cover the bit line stacks 240 and the bit line spacers 250. Subsequently, the second interlayer insulation layer 260 is planarized such that the second interlayer insulation layer 260 has a predetermined thickness at the bit line stacks 250.

Referring to FIG. 4, a photoresist film pattern 130 is formed on the second interlayer insulation layer 260. The photoresist film pattern 130 is formed such that only those portions of the second interlayer insulation layer 260 between the bit line stacks 240 are exposed, and the remaining portions of the second interlayer insulation layer 260 are covered, as is also well shown in FIG. 1. After the photoresist film pattern 130 is formed, the second interlayer insulation layer 260 and the first interlayer insulation layer 230 are etched using the photoresist film pattern 130 as an etching mask. As a result, contact holes 270 exposing the top surfaces of the conductive film pads 220 are formed, as shown in FIG. 5. Conductive plugs (not shown) can be formed by filling the contact holes 270 with conductive material.

As the integration density of semiconductor devices increases, it becomes more difficult to etch the insulation layers to form the contact holes 270 due to the accumulation of polymer. Thus, the amount of polymer generated during the etching process must be somehow limited to prevent the etching process from stopping prematurely. However, reducing the amount of polymer that will be generated is accompanied by a reduction in the selection ratio with respect to the bit line spacers 250 formed of silicon nitride. Therefore, when this countermeasure is taken, the bit line spacers 250 will be etched when the mask 130 is even slightly misaligned. When the bit line spacers 250 are over-etched, the bit line conductive layer 242 may be exposed, as shown at part A in FIG. 5. As a result, the conductive plug filling the contact hole will directly contact the bit line conductive layer 242, whereby the lower electrode of a capacitor and the bit line are short-circuited.

SUMMARY OF THE INVENTION

A first object of the present invention is to solve the above-described problems by providing a method of forming a self-aligned contact characterized by an alignment margin sufficient to prevent a short from being created between adjacent conductive layers.

To achieve this object, the present invention provides a method in which gate stacks are formed in a striped pattern on a semiconductor substrate, gate spacers are formed on the sidewalls of the gate stacks, conductive film pads serving as buried contact pads are formed between the gate spacers, a first interlayer insulation layer is formed on the conductive film pads and the gate stacks, bit line stacks are formed on the first interlayer insulation layer in a striped pattern extending crosswise relative to the striped pattern of the gate stacks, bit line spacers are formed on the sidewalls of the bit line stacks, a second interlayer insulation layer is formed on the first interlayer insulation layer in such a way that the upper surfaces of the bit line stacks are exposed, and a photoresist film pattern is formed on the second interlayer insulation layer in a striped pattern parallel to the striped pattern of the gate stacks. The photoresist film pattern exposes segments of the bit line stacks and portions of the second interlayer insulation layer disposed directly above respective ones of the conductive film pads. Contact holes exposing the conductive film pads are formed by etching the second interlayer insulation layer and the first interlayer insulation layer using the photoresist film pattern, the bit line stacks and the bit line spacers as etching masks. The conductive plugs contacting the conductive film pads are formed by filling the contact holes with a conductive material.

Preferably, each of the gate stacks includes a gate insulation layer, a gate conductive layer and a gate capping layer which are sequentially formed one atop the other on the semiconductor substrate, and each of the bit line stacks includes a barrier metal layer, a bit line conductive layer and a bit line capping layer which are sequentially formed one atop the other on the first interlayer insulation layer.

The second interlayer insulation is preferably formed by covering the first interlayer insulation layer and the bit line stacks with a layer of insulating material, and completely planarizing the layer, i.e., until the upper surfaces of the bit line stacks are exposed. The planarization may be performed using chemical mechanical polishing.

The conductive plug is preferably formed by depositing enough conductive material to fill the contact holes and cover the bit line stacks, and planarizing the result to expose the upper surfaces of the bit line stacks. The planarization may be performed using an etch back technique or chemical mechanical polishing.

Another object of the present invention is to provide a semiconductor device that is also free of the above-described problems of the prior art.

To achieve this object, the technique of forming a self-aligned contact as summarized above is incorporated into an overall method of manufacturing a semiconductor device as follows. After the conductive plugs are formed, a third interlayer insulation layer, an etch stop layer, an oxide layer and a hard mask layer are sequentially formed on the conductive plugs, the bit line stacks and the second interlayer insulation layer. A second photoresist film pattern is then formed on the hard mask layer. The hard mask layer and the oxide layer are etched using the second photoresist film pattern as an etching mask, this etching terminating when the etch stop layer is reached (exposed). Next, the second photoresist film pattern is removed. Second contact holes for use in forming capacitor lower electrodes are themselves formed by sequentially removing the exposed portions of the etch stop layer and third interlayer insulation layer using the hard mask layer as an etching mask. In this way, the second contact holes expose the conductive plugs.

The second contact holes are filled with a conductive material to form capacitor lower electrodes contacting the conductive plugs.

Preferably, the etch stop layer is formed of a material having an etching selection ratio with respect to the oxide layer. In particular, the etching stop layer is preferably a silicon nitride layer. The third interlayer insulation layer is preferably formed of a material having an etching selection ratio with respect to the etch stop layer.

BRIEF DESCRIPTION OF THE DRAWINGS

The above and other objects, features and advantages of the present invention will become more apparent from the following detailed description of the preferred embodiments thereof made with reference to the attached drawings, of which.

DETAILED DESCRIPTION OF THE PREFERRED EMBODIMENT

Figure 1:
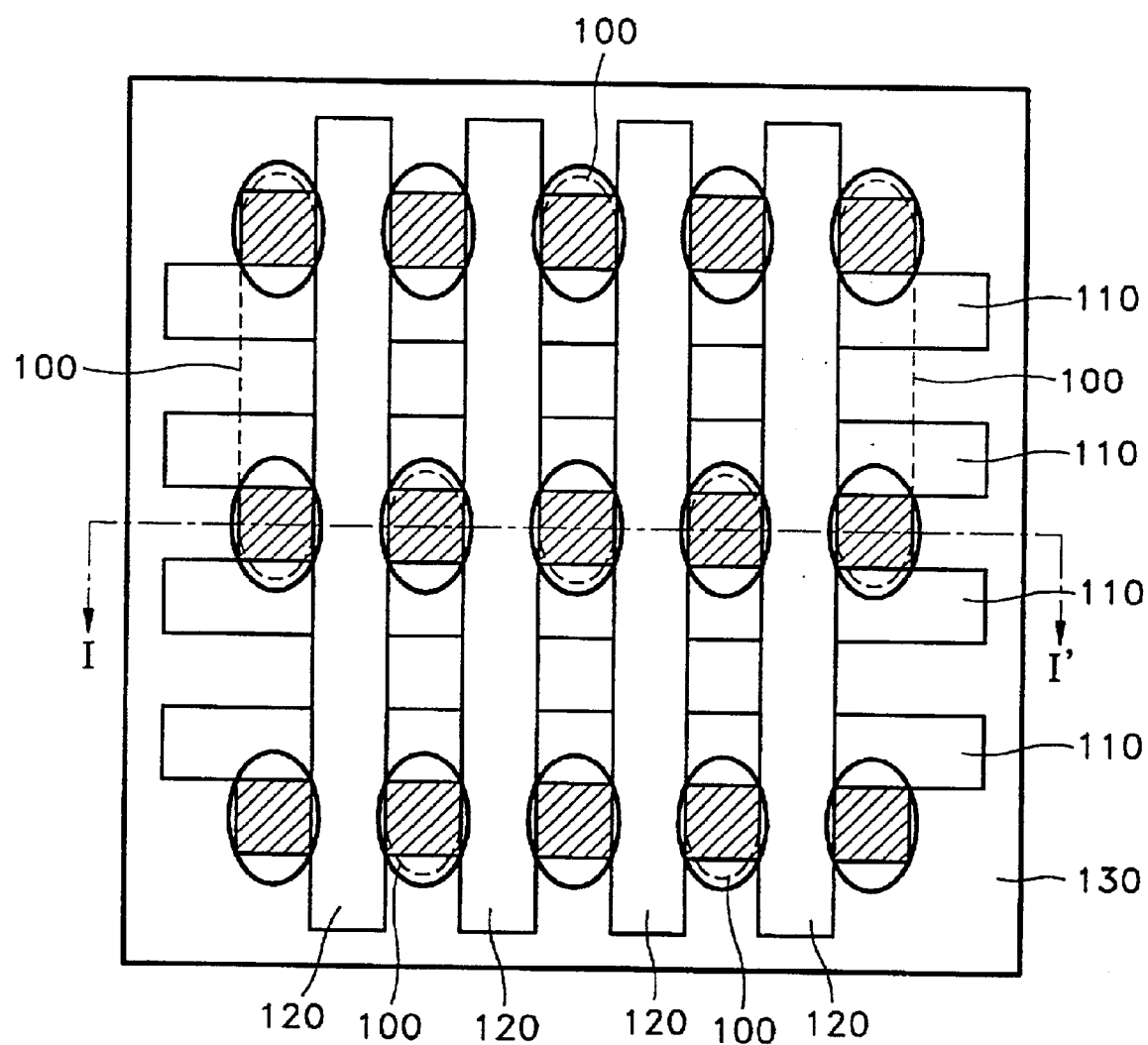
FIG. 1 is a plan view of a photoresist layer pattern used as an etching mask in performing an etching process in a conventional method of forming a self-aligned contact.
Figure 2:
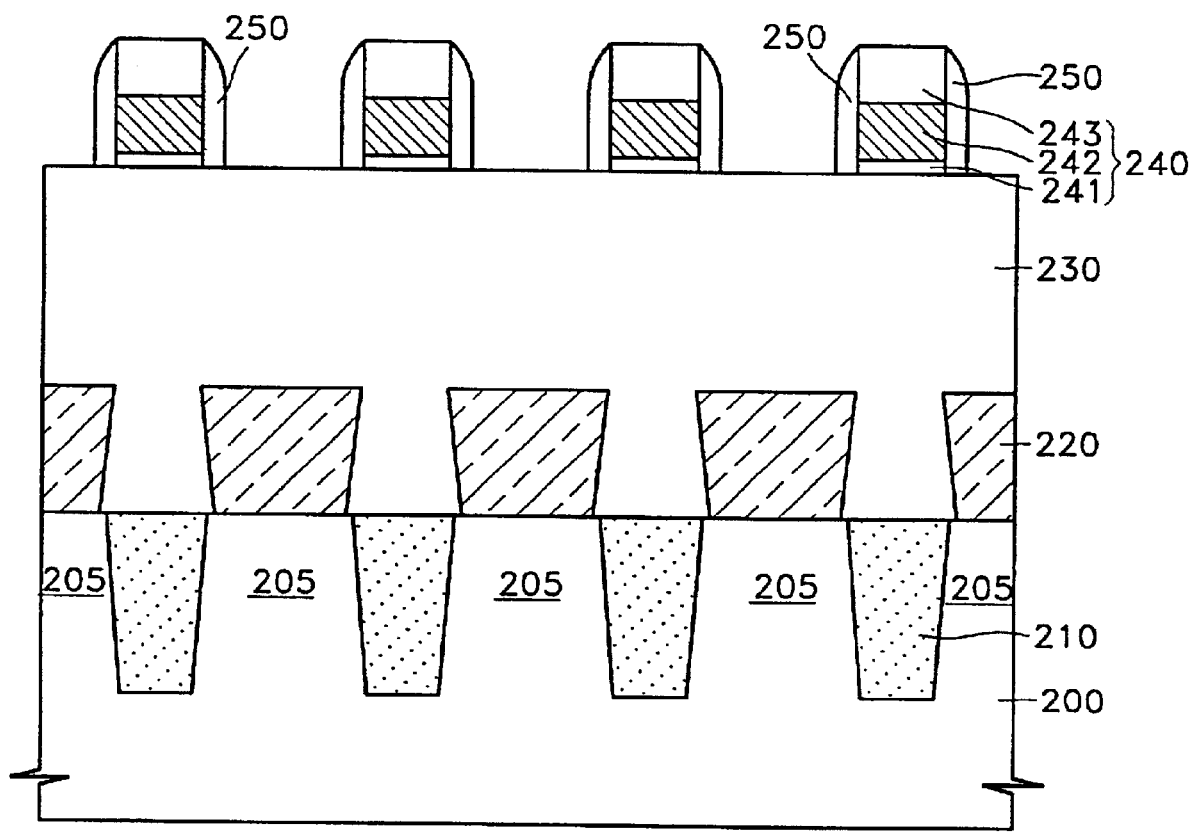
FIGS. 2 through 5 are sectional views of a lower portion of a semiconductor device, each taken along line I–I' of FIG. 1, and together illustrating the progression of the conventional method of forming a self-aligned contact.
Figure 3:
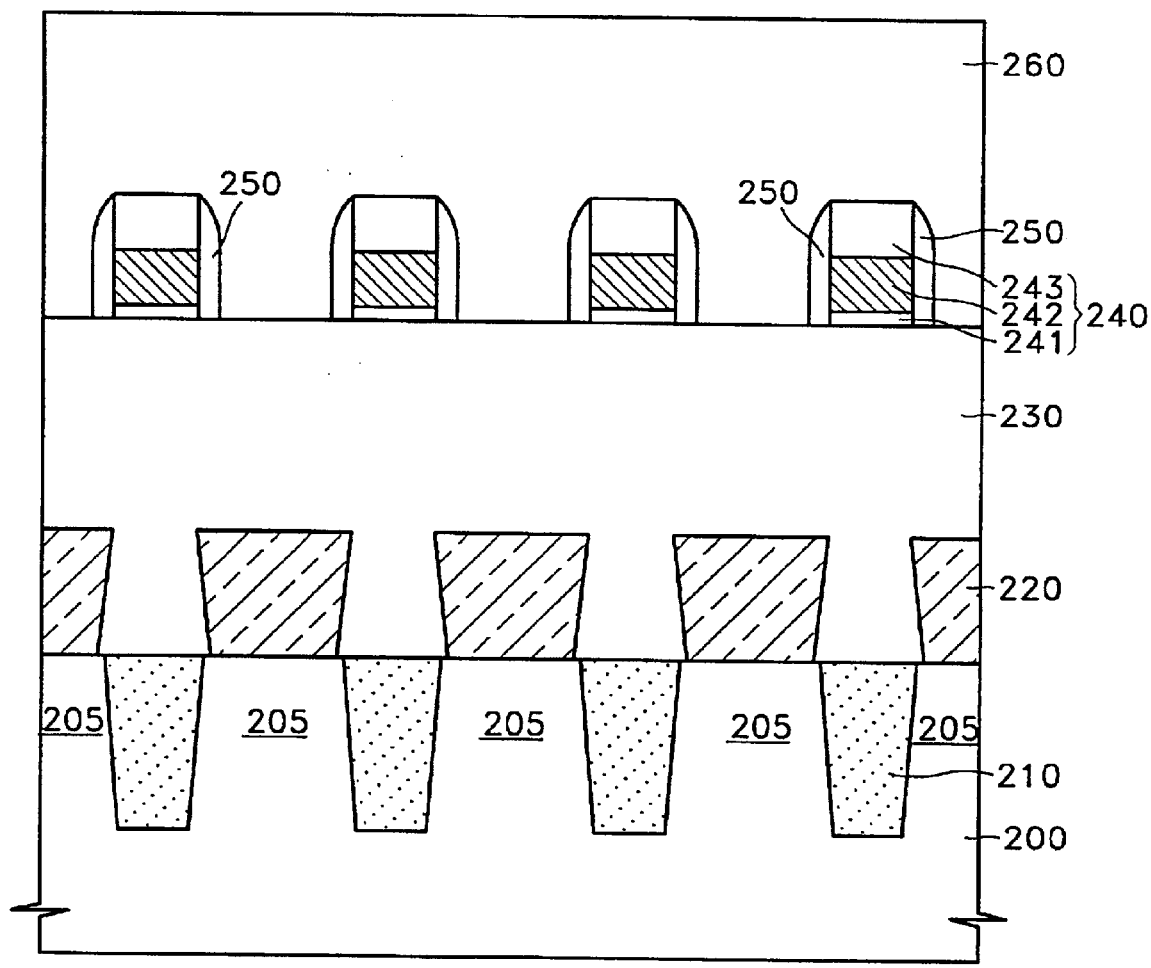
Figure 4:
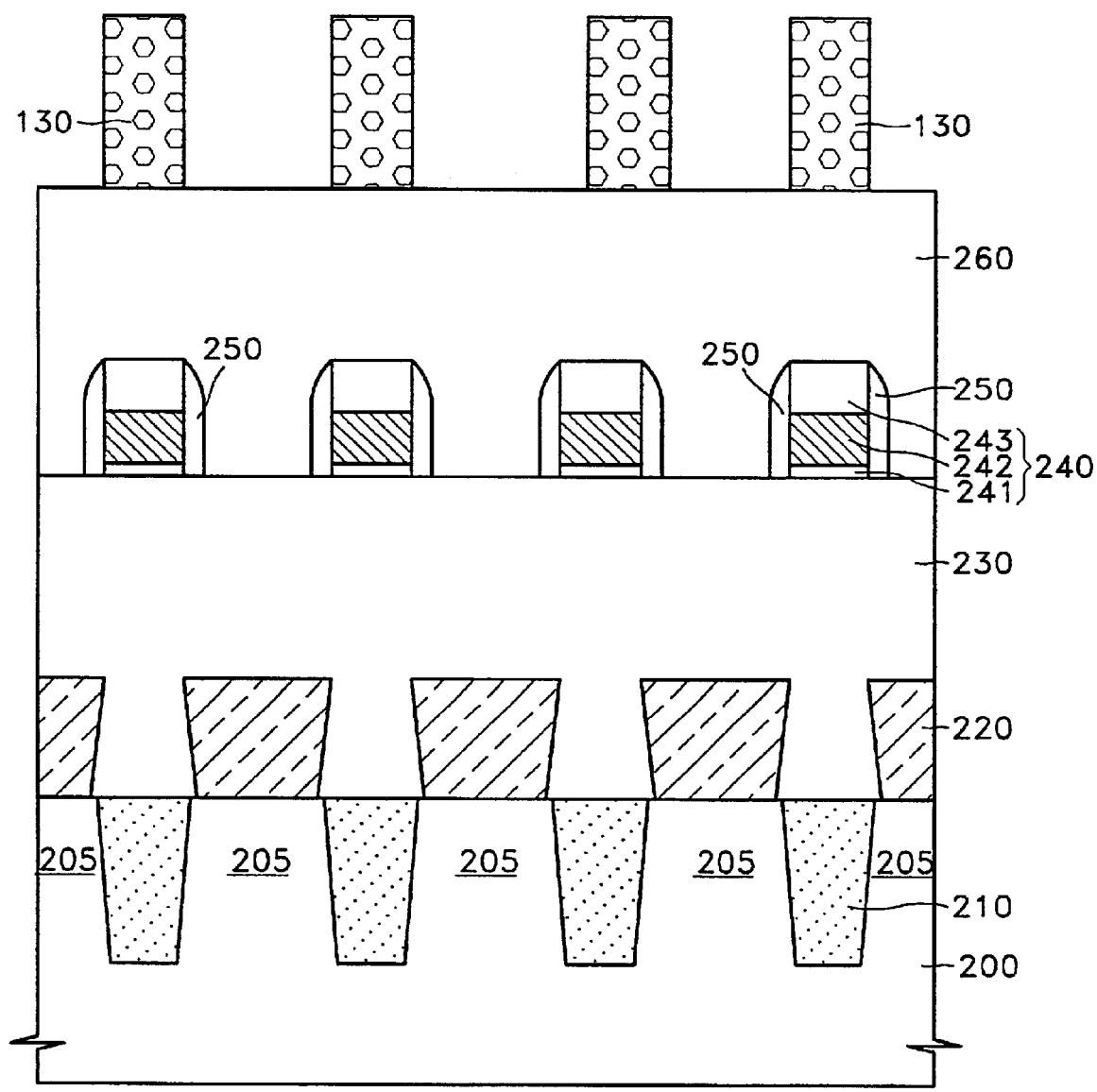
Figure 5:
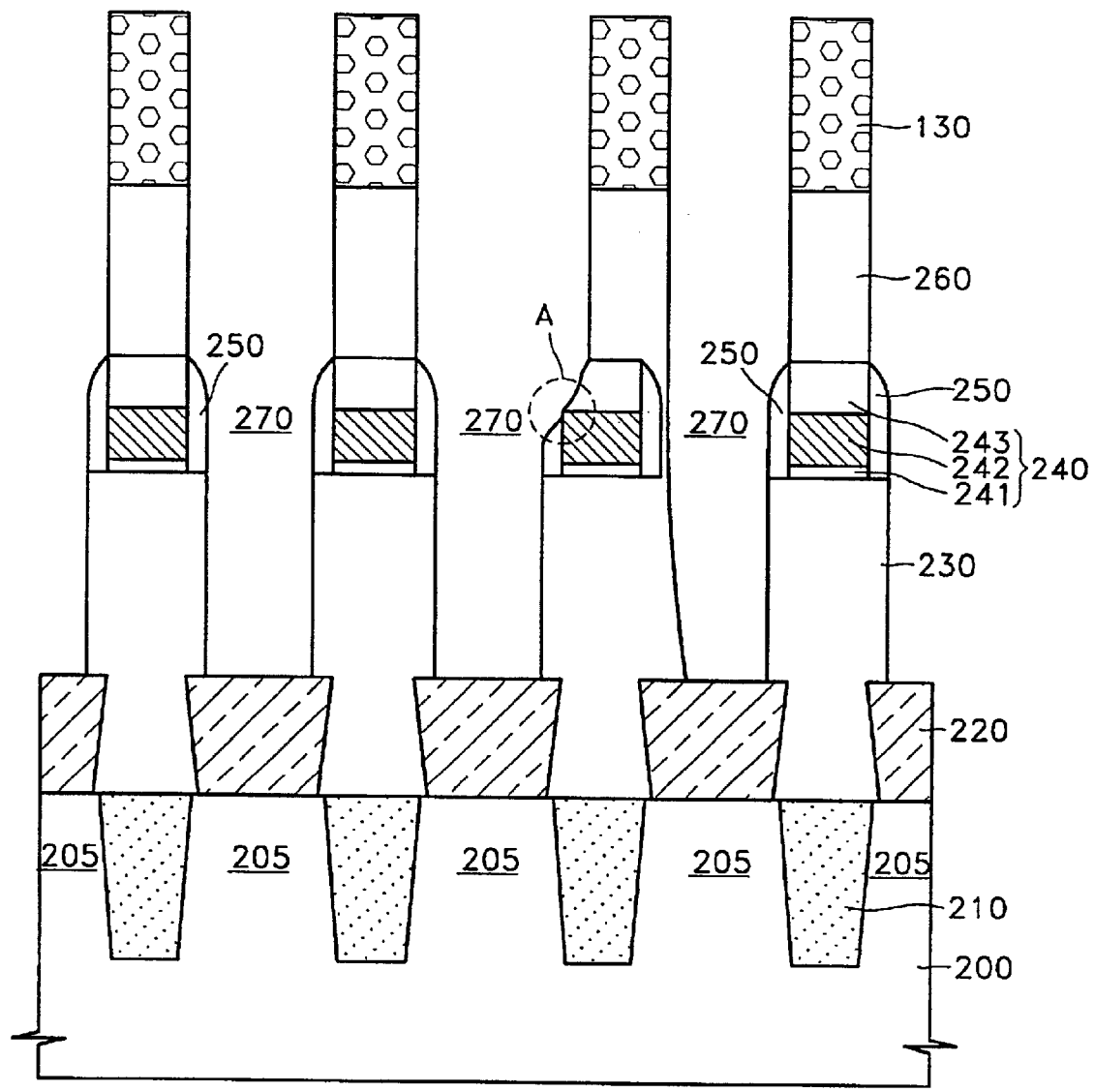

Hereinafter, embodiments of the present invention will be described in detail with reference to the attached drawings. In the drawings, the size and shapes of elements are exaggerated for the sake of clarity, and the same reference numerals denote like elements throughout the drawings. Also, when a layer is described as being disposed on another layer or on a semiconductor substrate, such description means that the layer can be directly disposed directly the other layer or semiconductor substrate or that an interlayer (s) can be present therebetween.

Figure 6:
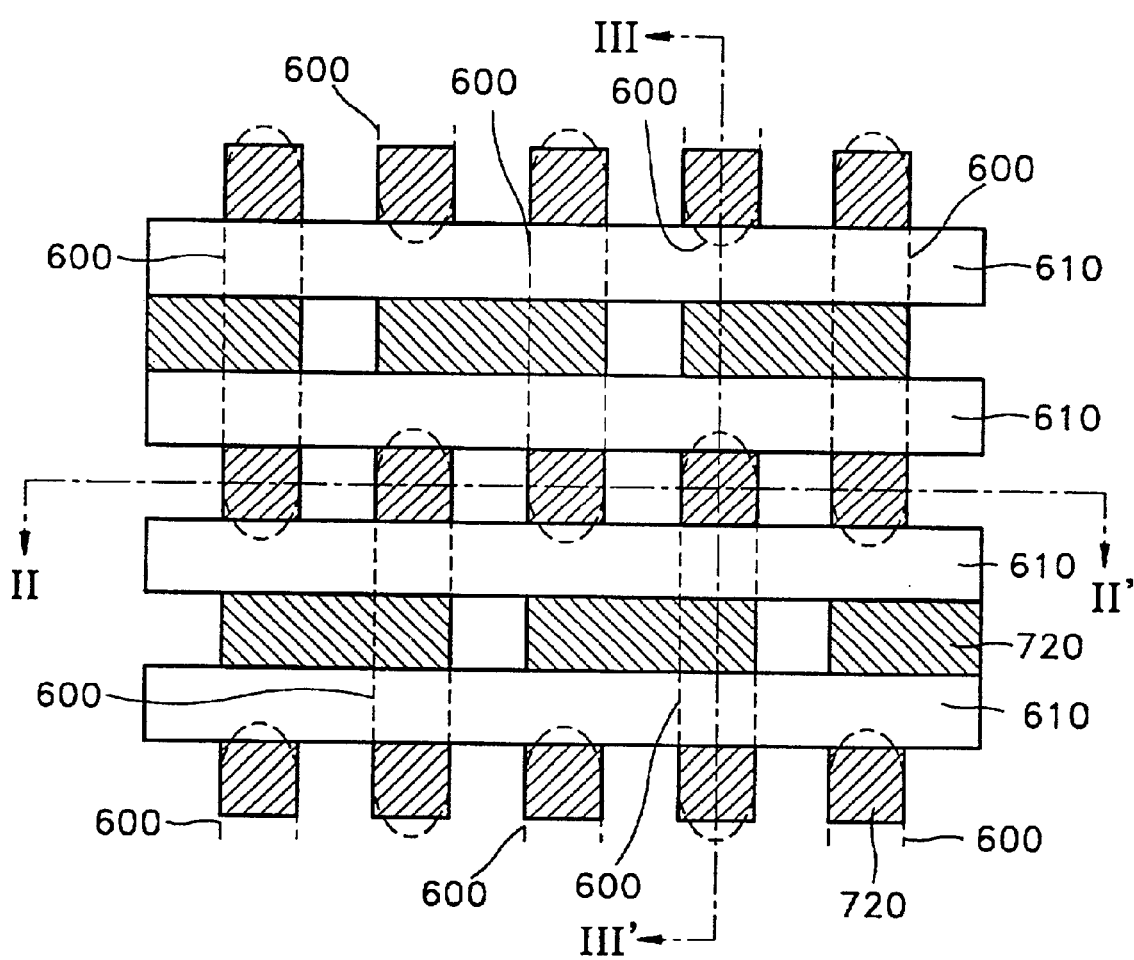
FIG. 6 is a plan view of a buried contact (BC) pad and a direct contact (DC) pad which are formed by a method of forming a self-aligned contact according to the present invention.

Referring first to FIGS. 6 and/or 7, reference numeral 600 denotes an active mask window for defining an active region and a filed region. Reference numeral 610 denotes a gate mask window for forming a gate stack pattern. Reference numeral 620 denotes a bit line mask window for forming a bit line pattern. Reference numeral 630 denotes a photoresist film pattern as an etching mask for forming a self-aligned contact hole.

Referring to FIGS. 6, 7, 8A and 8B, isolation regions 710 defining active regions 705 are formed on a substrate 700 using the active masks 600. The isolation regions 710 are shown in the form of trenches, but may take other forms. For example, the isolation regions 710 may be formed using LOCal Oxidation of Silicon (LOCOS). Next, gate stacks 610 are formed on the respective active regions 705 using the gate masks 610. Each of the gate stacks 610 may be formed by sequentially stacking and patterning a gate insulation layer 611, a gate conductive layer 612 and a gate capping layer 613. A metal silicide may be interposed between the gate conductive layer 612 and the gate capping layer 613 to reduce gate resistance. Next, gate spacers 615 are formed to cover the sidewalls of the gate stacks 610. The gate spacers 615 and the gate capping layers 613 are formed of silicon nitride having a selection ratio with respect to silicon oxide.

After the gate spacers 615 are formed, a typical lithographic method comprising exposure and development processes is performed to form a photoresist film pattern (not shown). Subsequently, an insulation layer (not shown) between the gate spacers 615 is etched using the photoresist film pattern as an etching mask, thereby forming contact holes exposing the surface of the semiconductor substrate 700 between the gate spacers 615. The contact holes are filled with a conductive material, for example, a polysilicon film, and an etch back process or a chemical mechanical planarization process is performed, thereby forming conductive film pads 720. Each of these conductive film pads 720 is used as a BC pad or a DC pad.

After the conductive film pads 720 are formed, a first interlayer insulation layer 730 is formed to cover the conductive film pads 720. Subsequently, bit line stacks 740 are formed on the first interlayer insulation layer 730 using the bit line mask windows 620 shown in FIG. 7. Each of the bit line stacks 740 may be formed by sequentially stacking a barrier metal layer 741, a bit line conductive layer 742 and a bit line capping layer 743 one on the other. Next, bit line spacers 750 are formed on the sidewalls of the bit line stacks 740 using a known method per se.

Figure 9A:
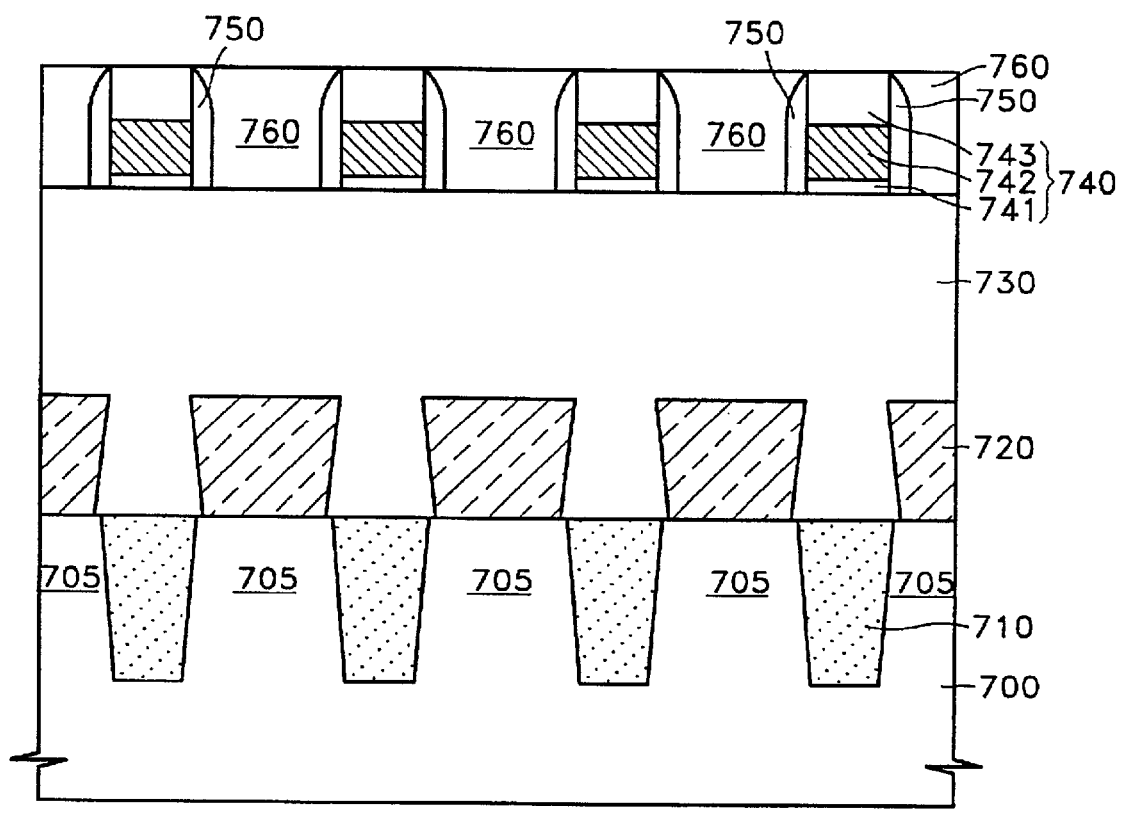
Figure 9B:
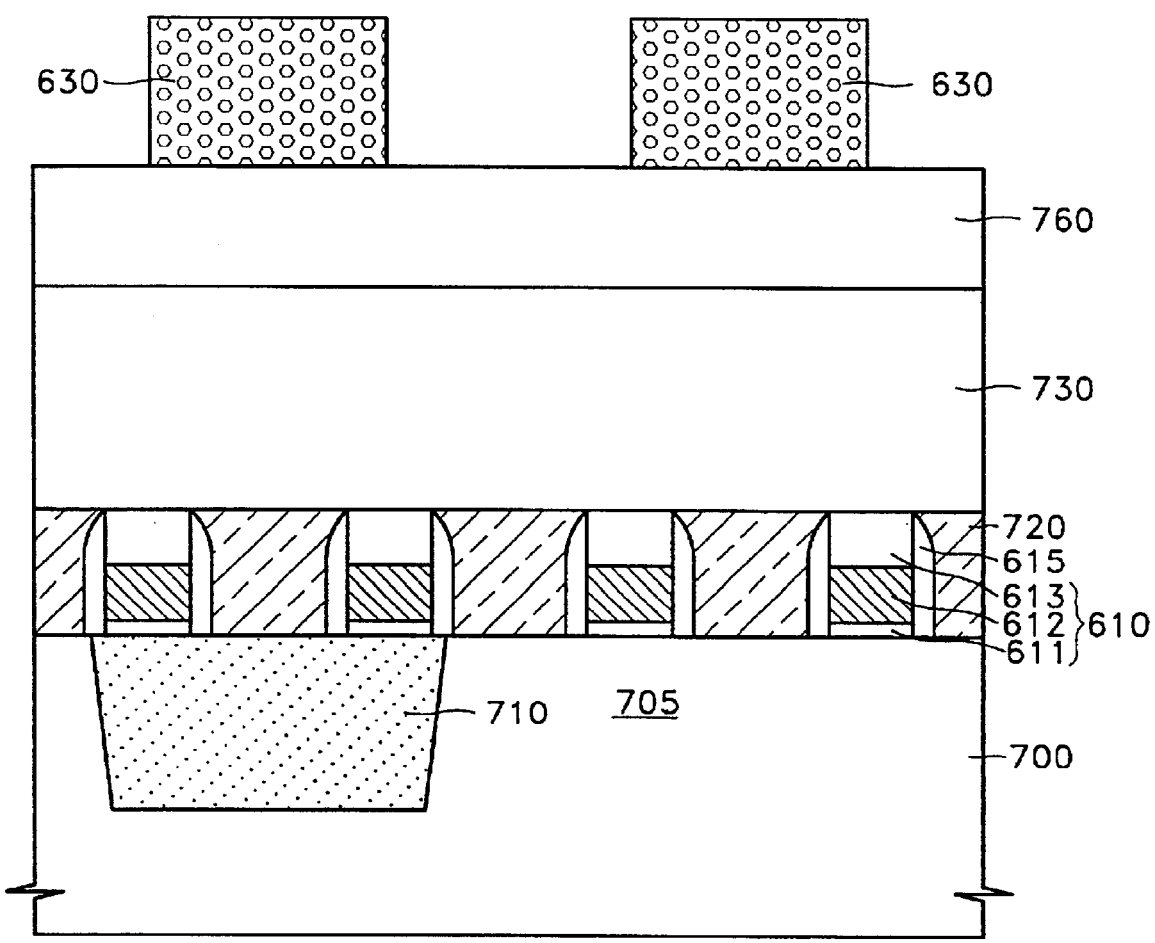

Referring to FIGS. 9A and 9B, a second interlayer insulation layer 760 is formed to completely cover the exposed surface of the first interlayer insulation layer 730, the bit line stacks 740 and the bit line spacers 750. Next, an etch back process or a chemical mechanical polishing process is performed to planarize the second interlayer insulation layer 760. When the chemical mechanical polishing is performed, the top surfaces of the bit line capping layers 743 are exposed at the completion of the process. Such a complete planarization is performed in order to minimize variations in the thickness of the second interlayer insulation layer 760 during subsequent processes.

Figure 7:
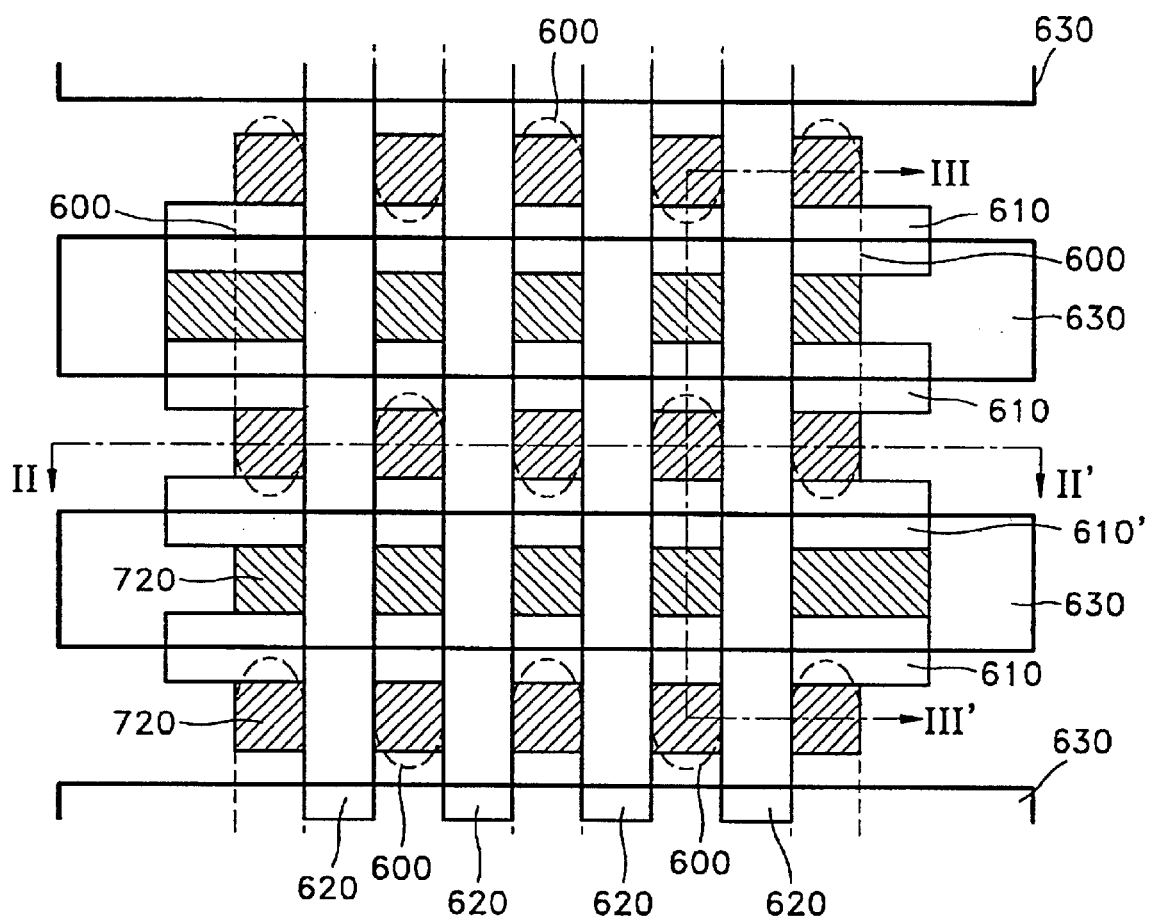
FIG. 7 is a plan view of a photoresist layer pattern used as an etching mask in performing an etching process in a method of forming a self-aligned contact according to the present invention.
Figure 8A:
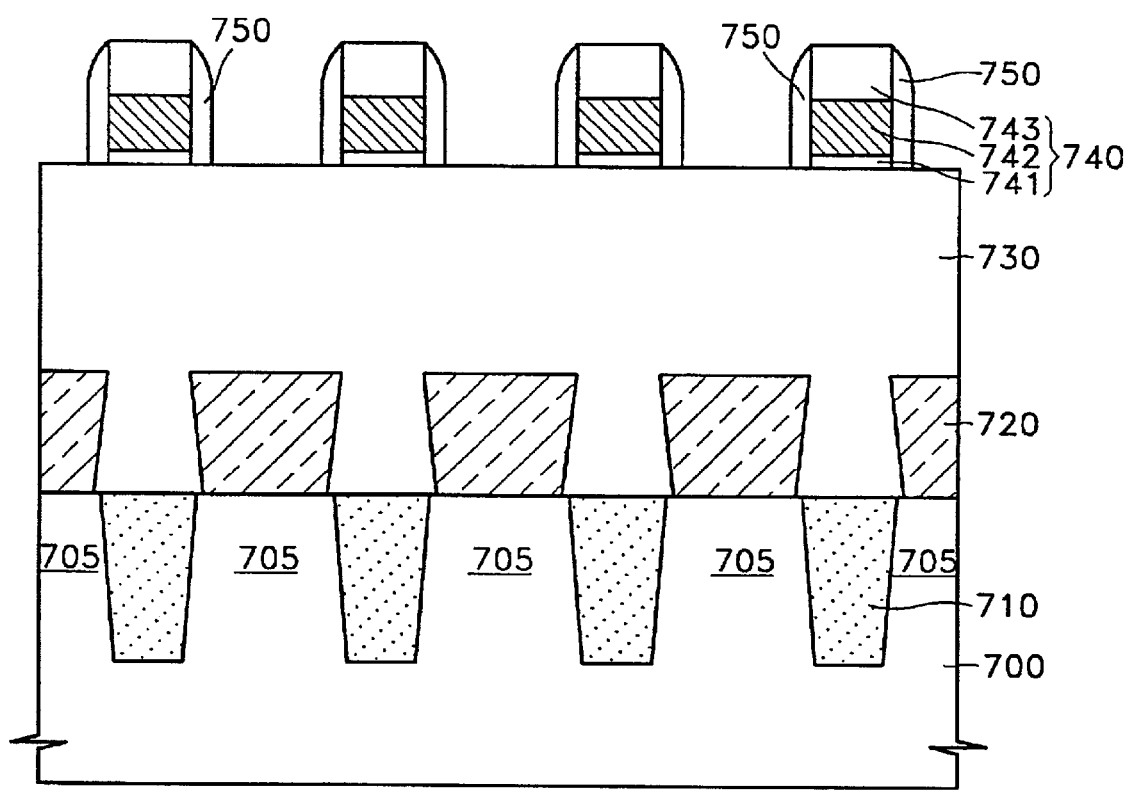
FIGS. 8A, 9A, 10A and 11A are sectional views of a lower portion of a semiconductor device, each taken along line II–II' of FIGS. 6 and 7 and together illustrating the progression of a method of forming a self-aligned contact according to the present invention.
Figure 8B:
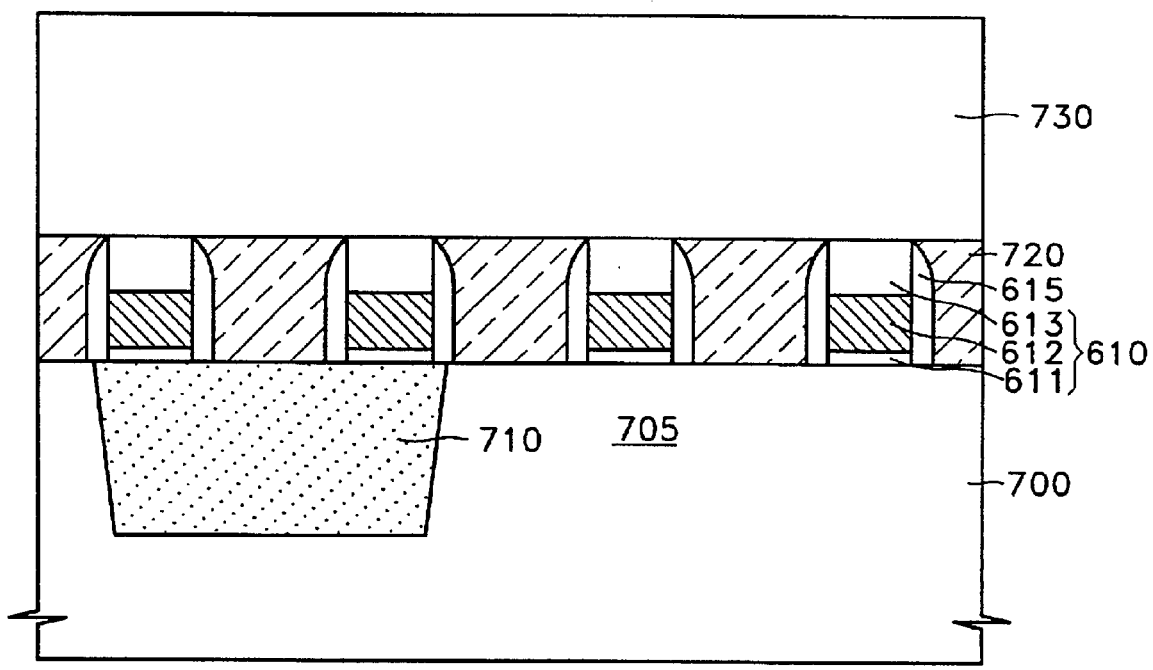
FIGS. 8B, 9B, 10B and 11B are sectional views of a lower portion of a semiconductor device, each taken along line III–III' of FIGS. 6 and 7 and together illustrating a method of forming a self-aligned contact according to the present invention.

Subsequently, a photoresist film is formed on the second interlayer insulation layer 760 and the bit line capping layers 743. The photoresist film is patterned to form a photoresist film pattern 630. As shown in FIG. 7, the gate stacks 610 are in the form of stripes, and the photoresist film pattern 630 comprises discrete laterally spaced apart stripes that directly overlie parts of the gate stacks 610 as extending parallel to the gate stacks 610. In other words, the photoresist film pattern 630 covers the insulation layers to one side only of each gate stack 610 and covers the conductive film pads 720 acting as DC pads, but exposes the insulation layers over the conductive film pads 720 acting as BC pads and the bit line stacks 740. Accordingly, the photoresist film pattern 630 is not shown in the sectional view of FIG. 9A that is taken along line II–II' of FIG. 7 but is shown in the sectional view of FIG. 9B that is taken along line III–III' of FIG. 7. By forming the photoresist film pattern 630 in a striped pattern, a sufficient alignment margin can be easily secured for the lithographic process for forming the photoresist film pattern.

Figure 10A:
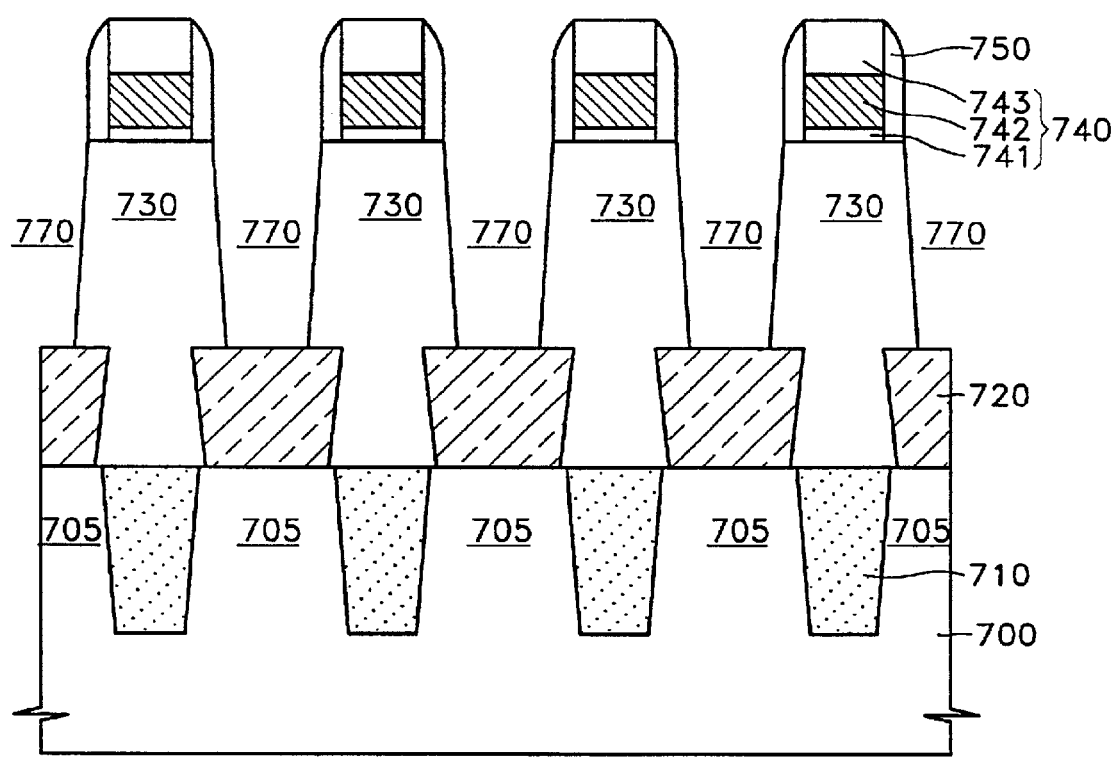
Figure 10B:
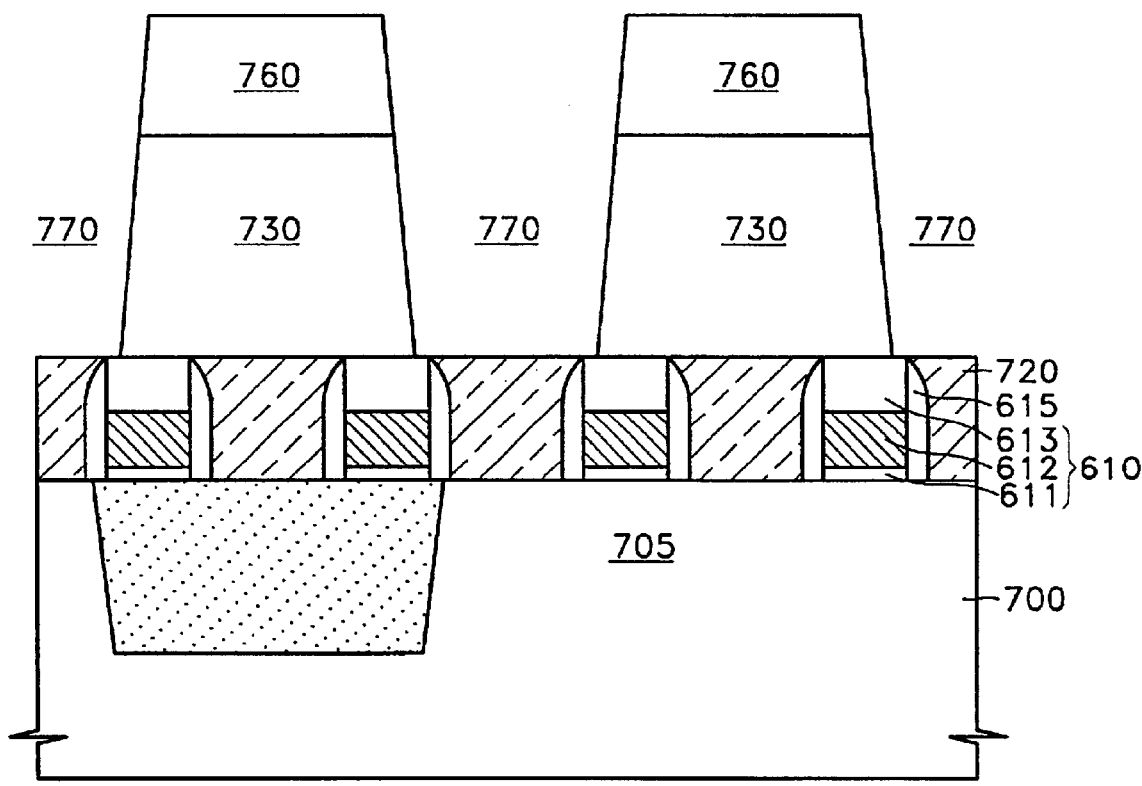

Referring to FIGS. 10A and 10B, the second interlayer insulation layer 760 and the first interlayer insulation layer 730 are sequentially etched using the photoresist film pattern 630 as an etching mask. During this etching process, the segments of the bit line stacks 740 that have already been exposed and the portions of the bit line spacers 750 that are exposed during the etching process act as an etching mask together with the photoresist film pattern 630. Because the photoresist film pattern 630 is in the form of stripes extending parallel to the gate stacks 610 and skewed (perpendicular) relative to the bit line stacks 740, the area of the underlying layer that is exposed is greater than that which is exposed using the conventional method. Thus, the etching process carried out when the present invention is practiced does not stop prematurely due to the presence of excessive polymer. Accordingly, an etching gas having a larger selection ratio with respect to the bit line capping layers 743 or the bit line spacers 750 can be used, to suppress the phenomenon in which the bit line capping layers 743 or the bit line spacers 750 are etched to the point where the bit line conductive layers 742 are exposed. After the etching process, contact holes 770 exposing the top surfaces of the conductive film pads 720 acting as BC pads are formed.

Figure 11A:
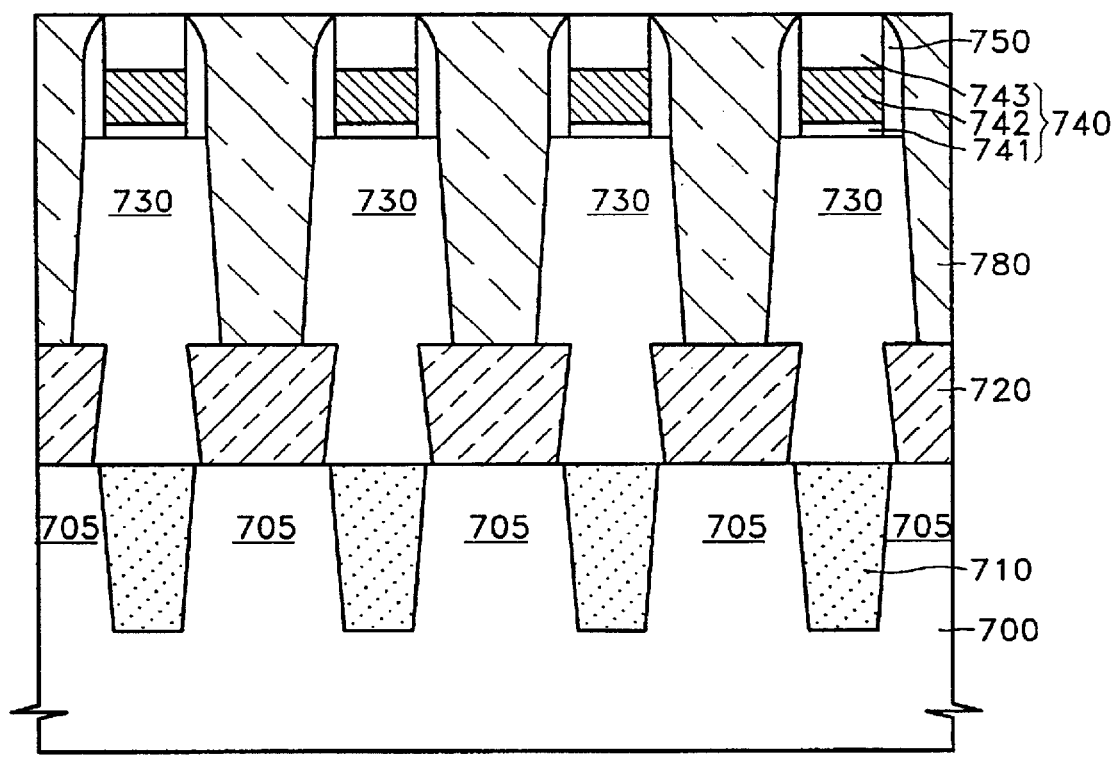
Figure 11B:
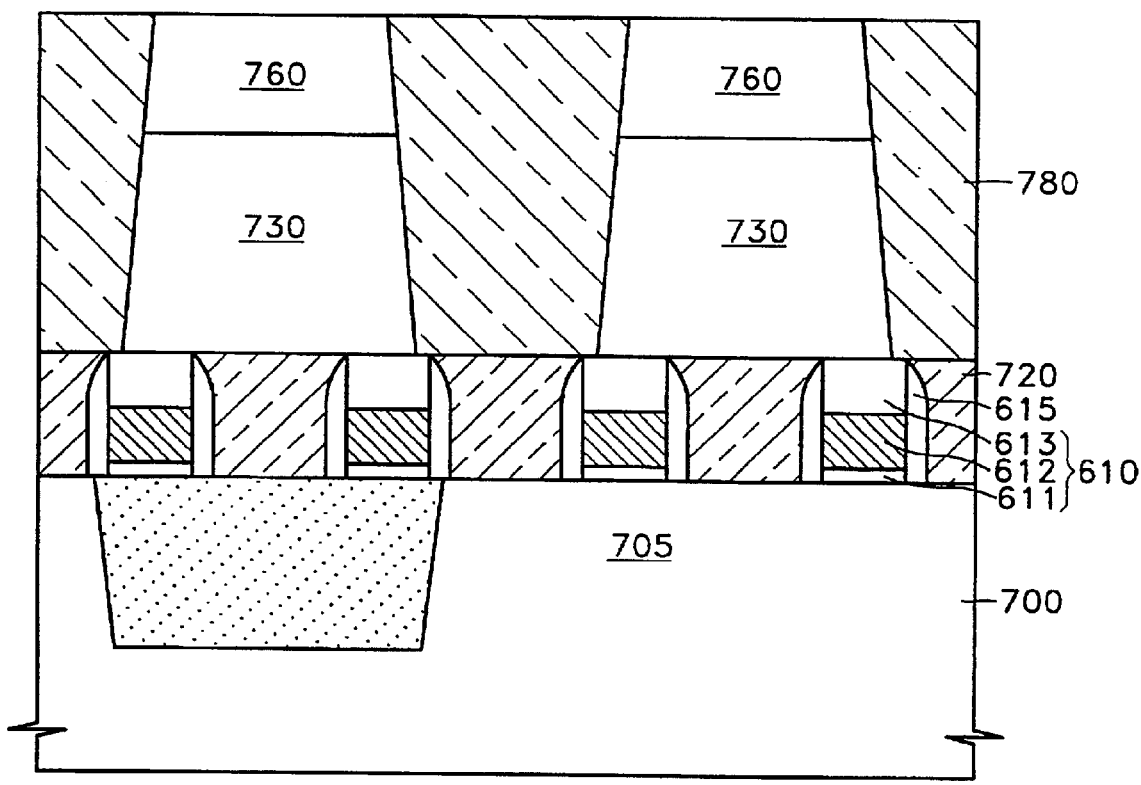

Referring to FIGS. 11A and 11B, conductive plugs 780 of polysilicon are formed within the contact holes 770. To this end, a polysilicon layer is formed on the entire surface of the resultant structure shown in FIGS. 10A and 10B. Then, an etch back process is performed to expose the surfaces of the bit line capping layers 743 of the bit line stacks 740. Consequently, the conductive plugs 780 are formed as isolated from one another other by the bit line stacks 740. Note, a chemical mechanical planarization process may be used instead of an etch back process.

A method of manufacturing a semiconductor device having a self-aligned contact according to the present invention will now be described with reference to FIGS. 7, and 12A–14B.

First, referring to FIGS. 12A and 12B, conductive film pads 720, which are self-aligned contacts, and conductive plugs 780 are formed as was described with reference to FIGS. 8A through 11B. Next, a third interlayer insulation layer 790 is formed on the bit line stacks 740, second interlayer insulation layer 760 and conductive plugs 780. The third interlayer insulation layer 790 can be a silicon oxide layer. Subsequently, an etch stop layer 800 is formed on the third interlayer insulation layer 790. The etch stop layer 800 can be of silicon nitride like the bit line spacers 750. Silicon nitride and silicon oxide have etching selection ratios so that the bit line spacers 750 can be protected by the third interlayer insulation layer 790 during a subsequent process of removing the etch stopper 800. After the etch stop layer 800 is formed, a fourth interlayer insulation layer 810 is formed on the etch stop layer 800. For example, when the etch stop layer 800 is formed of a silicon nitride, the fourth interlayer insulation layer 810 is formed of a silicon oxide. Next, a hard mask layer 820 and an anti-reflection layer 830 are sequentially formed on the fourth interlayer insulation layer 810. A photoresist film pattern 840 is formed on the anti-reflection layer 830.

Figure 12A:
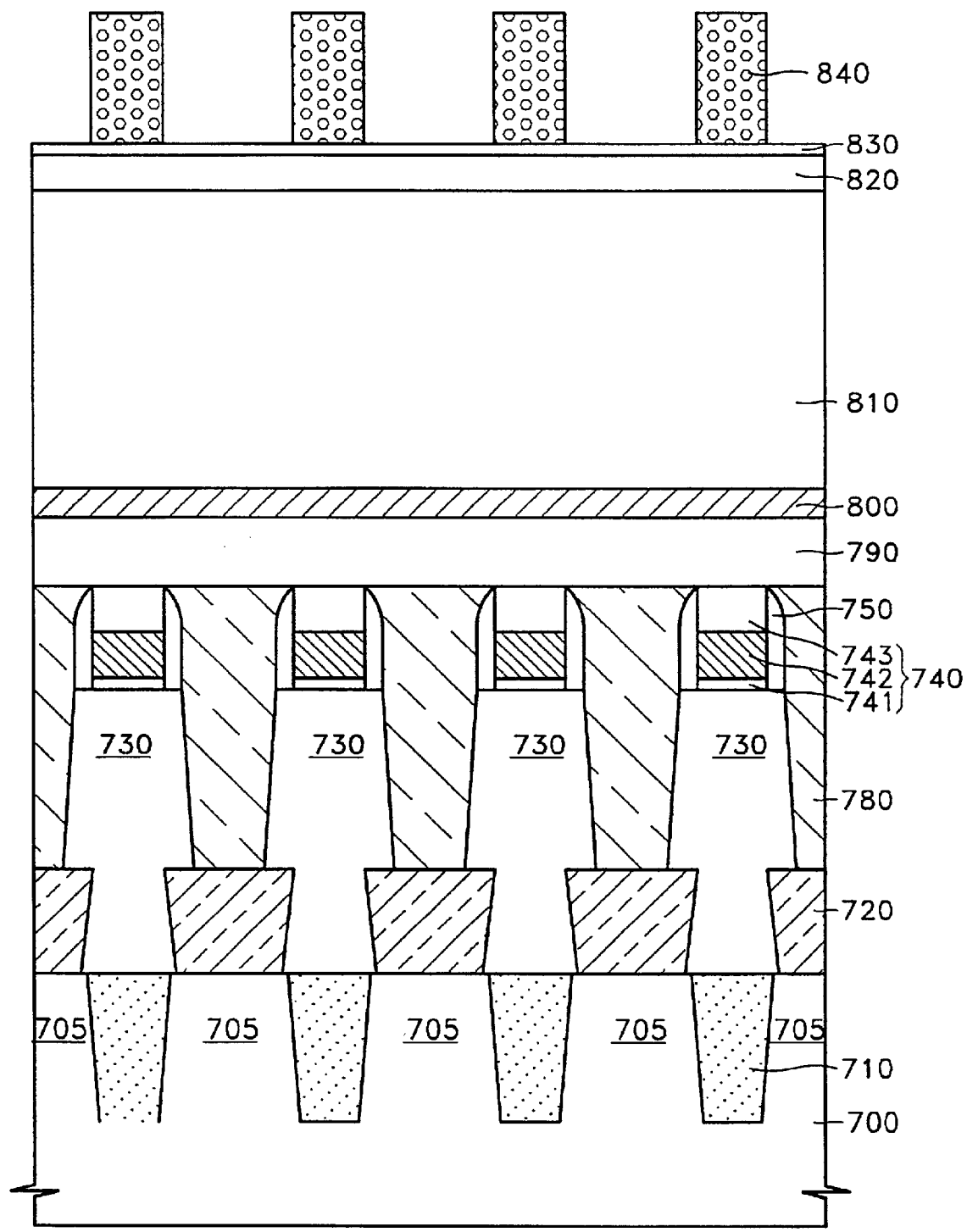
FIGS. 12A, 13A and 14A are sectional views of a semiconductor device, each taken along line II–II' of FIG. 7, and together illustrating a method of manufacturing a semiconductor device having a self-aligned contact according to the present invention.
Figure 12B:
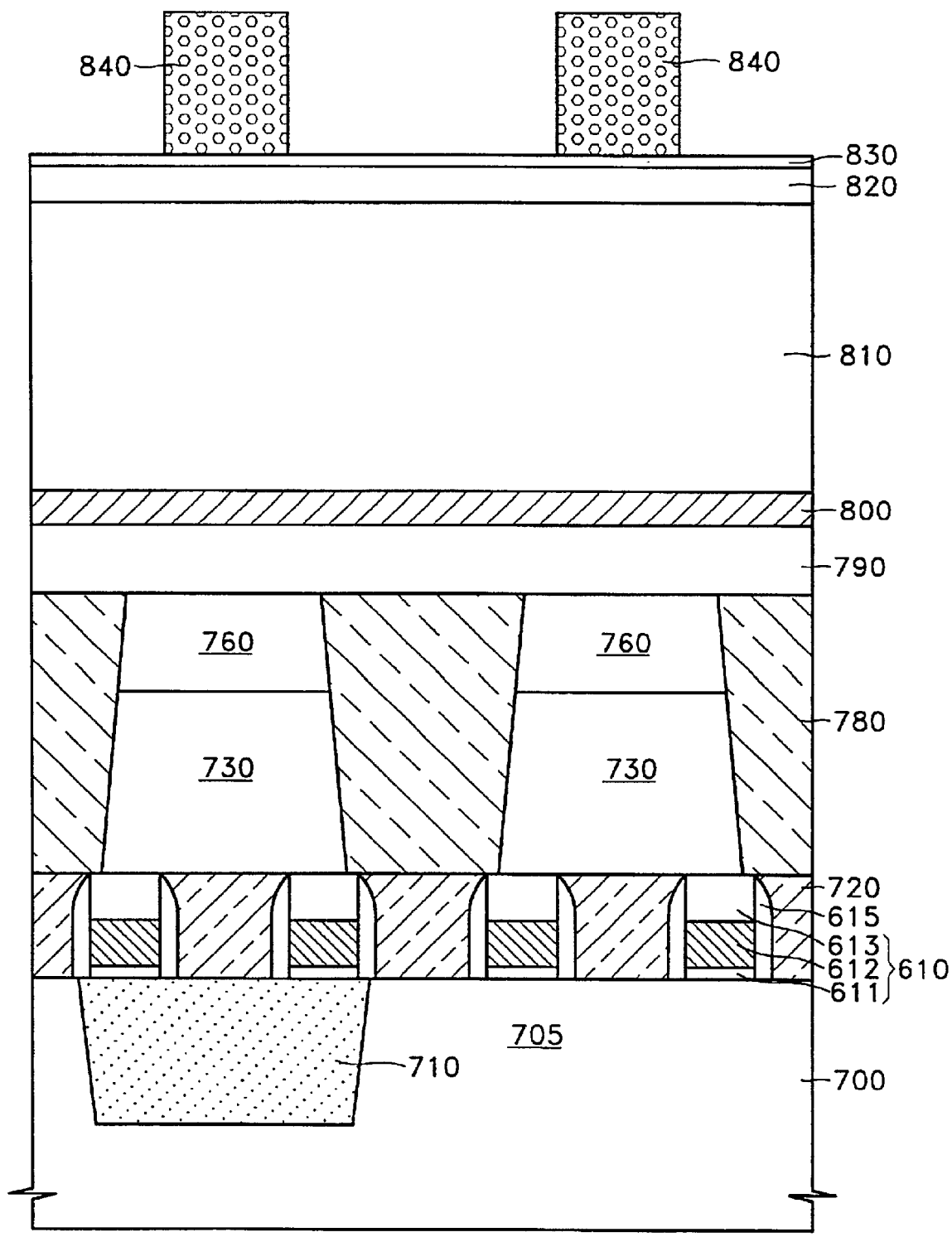
FIGS. 12B, 13B and 14B are sectional views of a semiconductor device, each taken along line III–III' of FIG. 7, and together illustrating a method of manufacturing a semiconductor device having a self-aligned contact according to the present invention.
Figure 13A:
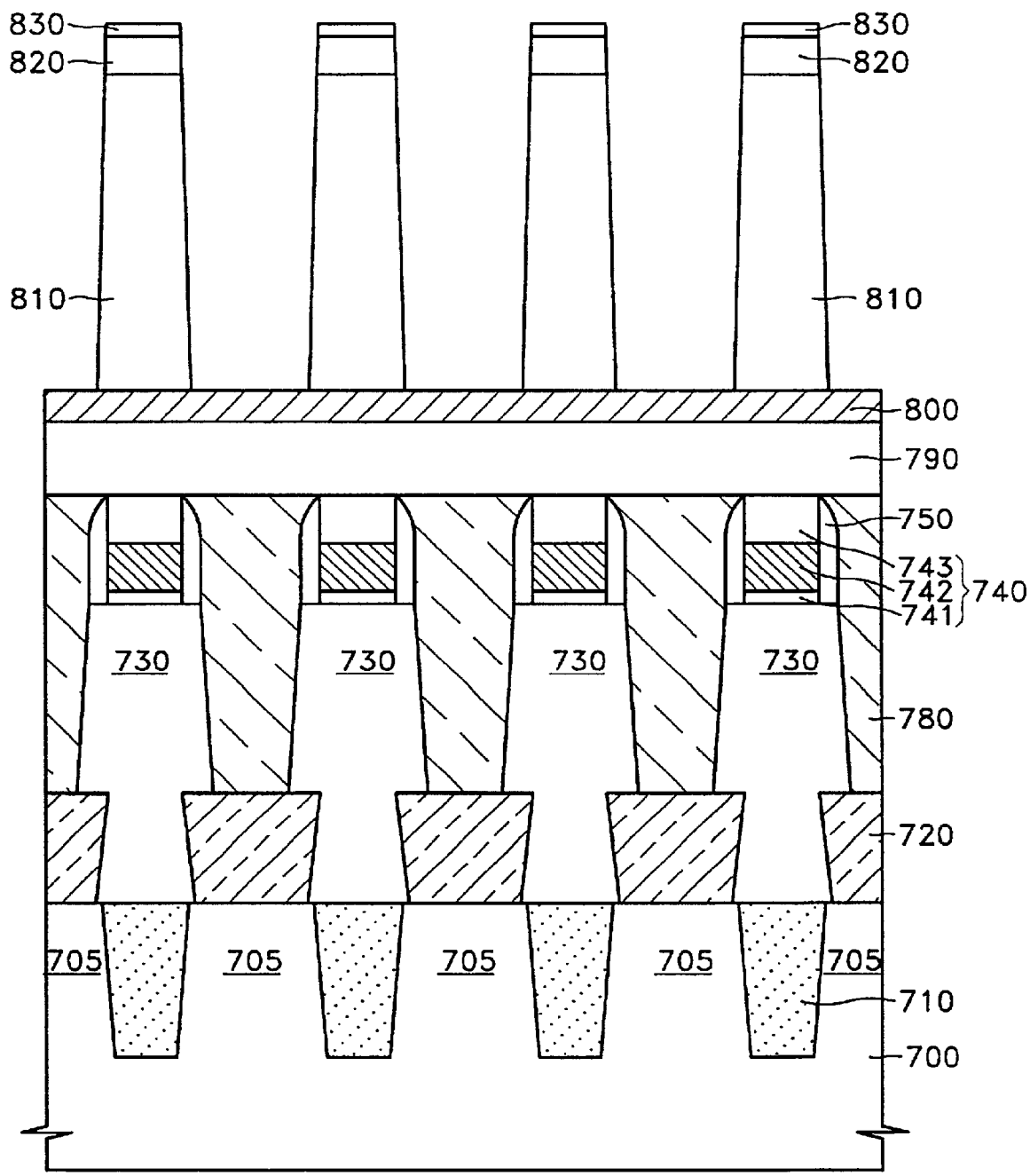
Figure 13B:
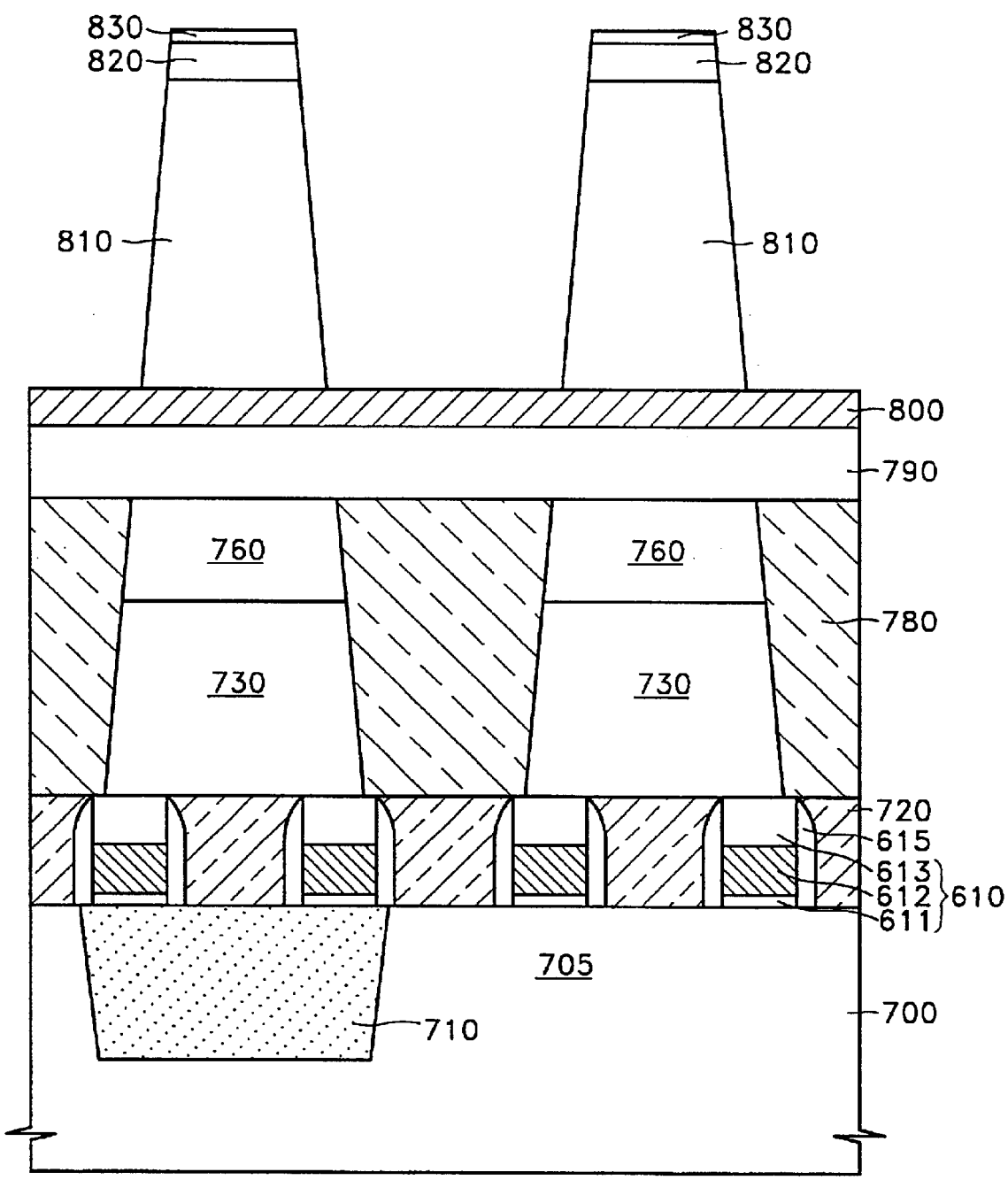

Referring to FIGS. 13A and 13B, the anti-reflection layer 830, the hard mask layer 820 and the fourth interlayer insulation layer 810 are sequentially etched using the photoresist film pattern 840 shown in FIGS. 12A and 12B as an etching mask, until the surface of the etch stopper 800 is partially exposed. As described above, the etching process is terminated once the surface of the etch stop layer 800 is exposed because the etch stop layer 800 and the fourth interlayer insulation layer 810 are formed of materials having large etching selection ratios. The photoresist film pattern 840 is removed after the etching process is completed.

Figure 14A:
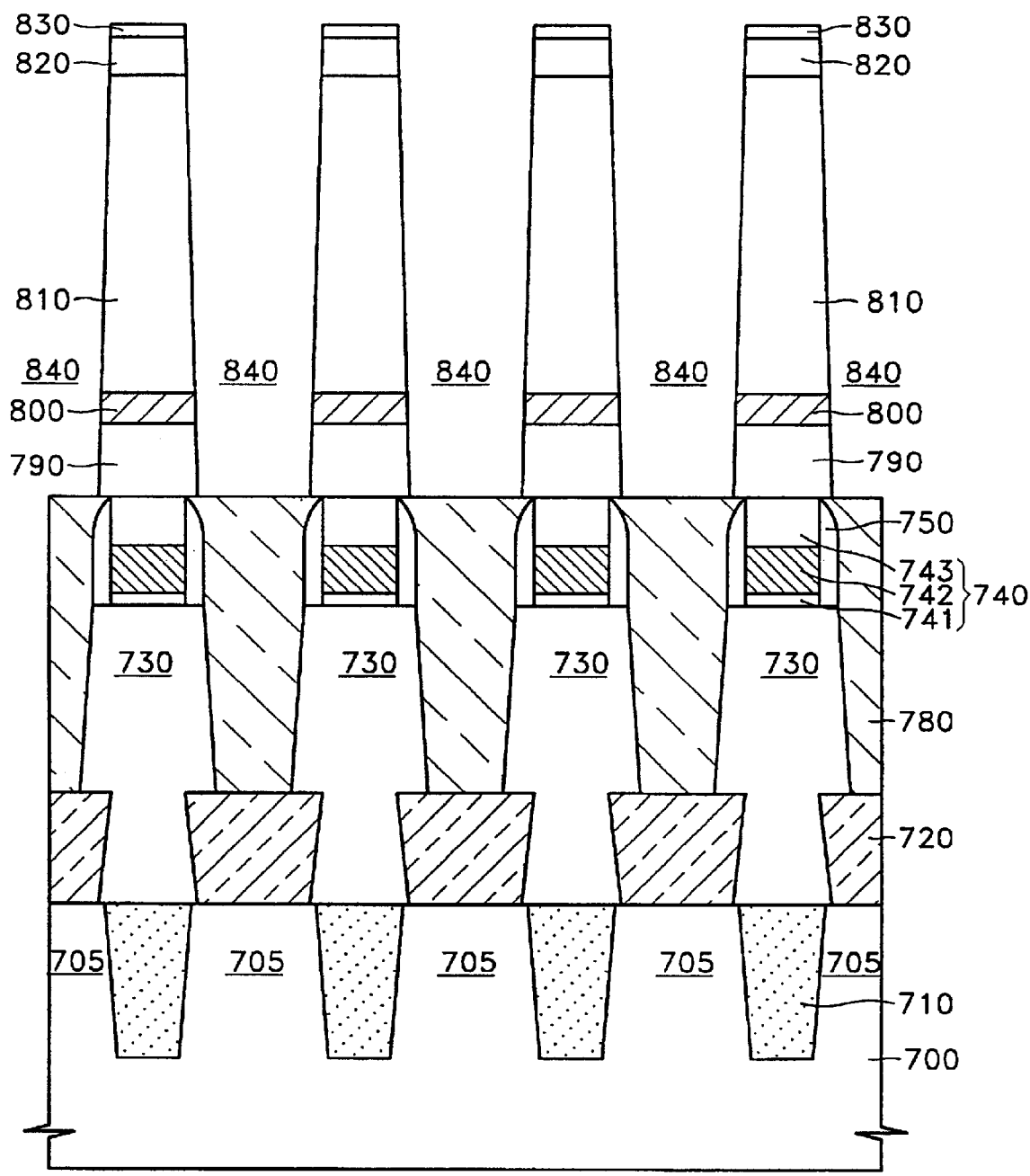
Figure 14B:
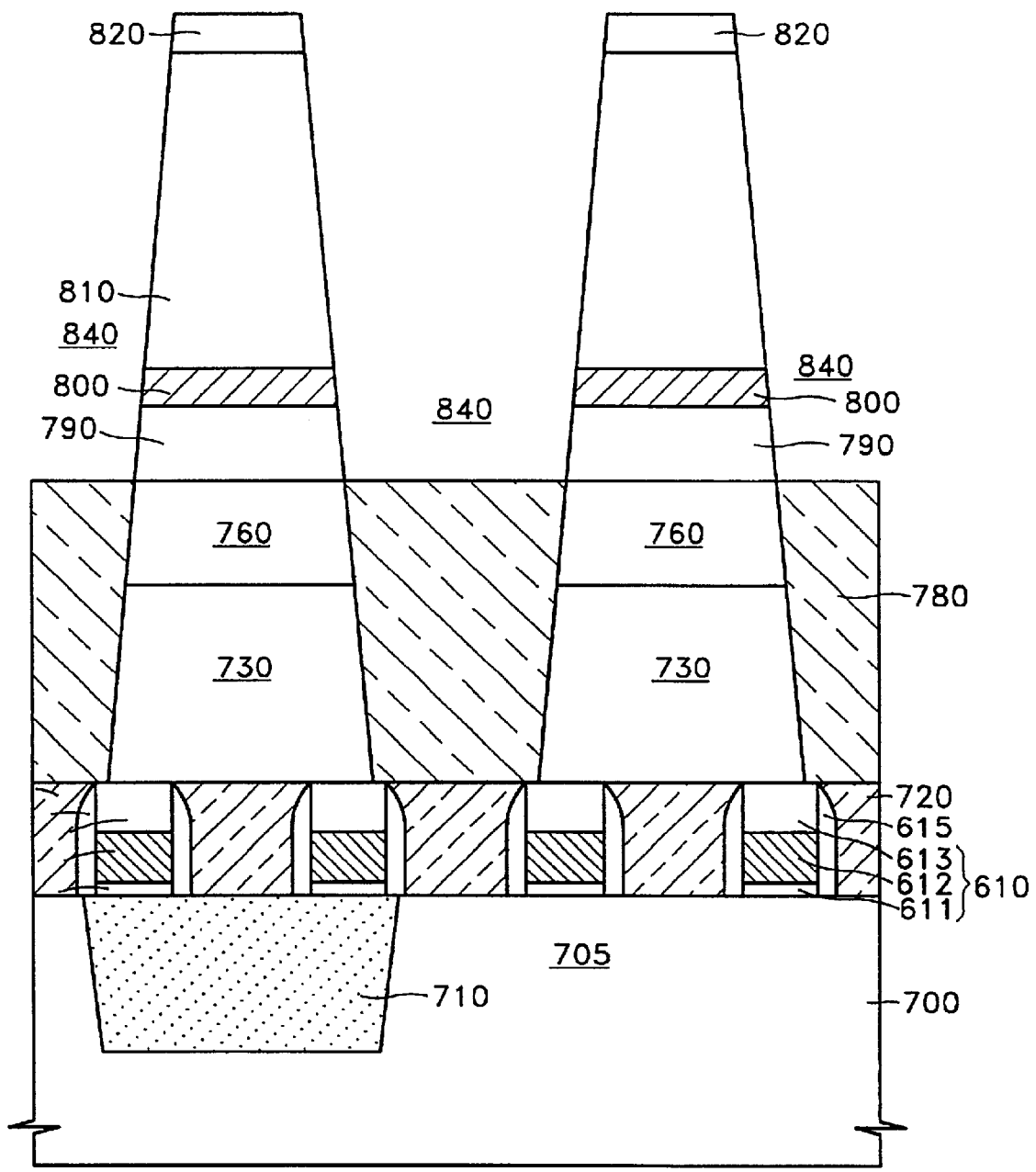

Referring to FIGS. 14A and 14B, the exposed etch stop layer 800 and the anti-reflection layer 830 shown in FIGS. 13A and 13B are removed, thereby partially exposing the third interlayer insulation layer 790 and the hard mask layer 820. The exposed portions of the third interlayer insulation layer 790 are removed by etching using the hard mask layer 820 as an etching mask, thereby completing the contact holes 840 and thus, exposing the upper surfaces of the conductive plugs 780.

Subsequently, the contact holes 840 are filled with a conductive material, thereby forming capacitor lower electrodes connected to active regions 705 through the conductive film pads 720 and the conductive plugs 780.

As described above, a method of forming a self-aligned contact and a method of manufacturing a semiconductor device incorporating the same have the following advantages.

Firstly, concerning the photoresist pattern that serves as an etching mask for forming the contact holes in which the conductive plugs are formed, the photoresist film pattern comprises stripes extending parallel to gate stacks and skewed relative to the bit line stacks, whereby a sufficient alignment margin between the photoresist film pattern and the bit line stacks is secured. In addition, the area of an underlying layer that can be exposed is greater in comparison with a conventional method of forming a contact. Accordingly, a premature termination of the etching process, due to an accumulation of polymer in the contact hole as it is being formed, can be prevented. Consequently, an etching gas having a larger selection ratio with respect to bit line capping layers or bit line spacers can be used, to suppress a phenomenon in which the bit line capping layers or the bit line spacers are etched to the point where the bit line conductive layers are exposed.

Secondarily, variations in the thickness of the second interlayer insulation layer can be minimized during subsequent processes because the surface of a bit line stack is exposed by performing a complete planarization of the second interlayer insulation layer.

Thirdly, an etch back process, that is simpler and more economical than a chemical mechanical planarization process, may be used to planarize a conductive layer in forming the conductive plugs as isolated from one.

Fourthly, contact holes for forming capacitor lower electrodes may be easily formed after the conductive plugs are formed, by forming an insulation layer having a predetermined thickness on the resultant structure.

Although the present invention has been described above in connection with the preferred embodiments thereof, various changes to and modifications of the preferred embodiments will become readily apparent to those of ordinary skill in the art. All such changes and modifications are seen to be within the true spirit and scope of the present invention as defined by the appended claims.

What is claimed is:

1. A method forming self-aligned contacts, comprising the steps of:

forming gate stacks in a series of parallel stripes on a semiconductor substrate;

forming gate spacers on the sidewalls of the gate stacks;

forming conductive film pads to serve as buried contact pads between the gate spacers;

forming a first interlayer insulation layer over the conductive film pads and the gate stacks;

forming bit line stacks, in a series of parallel stripes skewed relative to the gate stacks, on the first interlayer insulation layer;

forming bit line spacers on the sidewalls of the bit line stacks;

forming a second interlayer insulation layer on the first interlayer insulation layer in such a way that upper surfaces of the bit line stacks are exposed;

forming a photoresist film pattern, on the second interlayer insulation layer, in the form of laterally spaced apart stripes of photoresist extending parallel to the gate stacks, the photoresist film pattern exposing segments of the bit line stacks and exposing portions of the second interlayer insulation layer located directly above respective ones of the conductive film pads, respectively;

etching the second interlayer insulation layer and the first interlayer insulation layer using the photoresist film pattern, the bit line stacks and the bit line spacers as etching masks to form contact holes exposing the conductive film pads by; and filling the contact holes with a conductive material to form conductive plugs contacting the conductive film pads.

2. The method of claim 1, wherein said forming of the gate stacks comprises sequentially forming a gate insulation layer, a gate conductive layer and a gate capping layer on the semiconductor substrate.

3. The method of claim 1, wherein said forming of the bit line stacks comprises sequentially forming a barrier metal layer, a bit line conductive layer and a bit line capping layer on said first interlayer insulation layer.

4. The method of claim 1, wherein said forming of the second interlayer insulation layer comprises forming a layer of insulation over the first interlayer insulation layer and the bit line stacks, and planarizing said layer of insulation until the upper surfaces of said bit line stacks are exposed.

5. The method of claim 4, wherein said planarizing comprises chemical mechanical polishing.

6. The method of claim 1, wherein said forming of the conductive plugs comprises depositing conductive material sufficient to form a layer that fills the contact holes and covers the bit line stacks, and planarizing the layer of conductive material to expose the upper surfaces of the bit line stacks.

7. The method of claim 6, wherein said planarizing comprises an etch back technique.

8. The method of claim 6, wherein said planarizing comprises chemical mechanical polishing.

9. A method of forming a semiconductor device, comprising the steps of:

forming gate stacks in a series of parallel stripes on a semiconductor substrate;

forming gate spacers on the sidewalls of the gate stacks;

forming conductive film pads to serve as buried contact pads between the gate spacers;

forming a first interlayer insulation layer over the conductive film pads and the gate stacks;

forming bit line stacks, in a series of parallel stripes skewed relative to the gate stacks, on the first interlayer insulation layer;

forming bit line spacers on the sidewalls of the bit line stacks;

forming a second interlayer insulation layer on the first interlayer insulation layer in such a way that upper surfaces of the bit line stacks are exposed;

forming a photoresist film pattern, on the second interlayer insulation layer, in the form of laterally spaced apart stripes of photoresist extending parallel to the gate stacks, the photoresist film pattern exposing segments of the bit line stacks and exposing portions of the second interlayer insulation layer located directly above respective ones of the conductive film pads, respectively;

etching the second interlayer insulation layer and the first interlayer insulation layer using the photoresist film pattern, the bit line stacks and the bit line spacers as etching masks to form contact holes exposing the conductive film pads by;

filling the contact holes with a conductive material to form conductive plugs contacting the conductive film pads;

sequentially forming a third interlayer insulation layer, an etch stop layer, an oxide layer and a hard mask layer on the conductive plugs, the bit line stacks and the second interlayer insulation layer;

forming a second photoresist film pattern on the hard mask layer;

etching the hard mask layer and the oxide layer using the second photoresist film pattern as an etching mask until portions of the etch stop layer are exposed;

subsequently removing the second photoresist film pattern; and forming second contact holes for use in forming capacitor lower electrodes by sequentially removing the exposed etch stop layer and underlying portions of the third interlayer insulation layer using the hard mask layer as an etching mask, the second contact holes exposing the conductive plugs.

10. The method of claim 9, further comprising the step of filling the second contact holes with a conductive material to form capacitor lower electrodes contacting the conductive plugs.

11. The method of claim 9, wherein said forming of the gate stacks comprises sequentially forming a gate insulation layer, a gate conductive layer and a gate capping layer on the semiconductor substrate.

12. The method of claim 9, wherein said forming of the bit line stacks comprises sequentially forming a barrier metal layer, a bit line conductive layer and a bit line capping layer on the first interlayer insulation layer.

13. The method of claim 9, wherein said forming of the second interlayer insulation comprises forming a layer of insulating material over the first interlayer insulation layer and the bit line stacks, and planarizing the layer of insulating material until upper surfaces of the bit line stacks are exposed.

14. The method of claim 13, wherein said planarizing comprises chemical mechanical polishing.

15. The method of claim 9, wherein said forming of the conductive plugs comprises depositing conductive material sufficient to form a layer that fills the contact holes and covers the bit line stacks, and planarizing the layer of conductive material to expose the upper surfaces of the bit line stacks.

16. The method of claim 15, wherein said planarizing is performed using an etch back technique.

17. The method of claim 15, wherein said planarizing comprises chemical mechanical polishing.

18. The method of claim 9, wherein the etch stop layer is formed of a material having an etching selection ratio with respect to the oxide layer.

19. The method of claim 18, wherein said forming of the etch stop layer comprises forming a silicon nitride layer on the third interlayer insulation layer.

20. The method of claim 9, wherein the third interlayer insulation layer is formed of a material having an etching selection ratio with respect to the etch stop layer.

* * * * *